United States Patent
Wang

(10) Patent No.: US 10,068,658 B2
(45) Date of Patent: Sep. 4, 2018

(54) SHIFT REGISTER UNIT, DRIVING CIRCUIT AND METHOD, ARRAY SUBSTRATE AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventor: Zheng Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 117 days.

(21) Appl. No.: 14/906,744

(22) PCT Filed: Sep. 16, 2015

(86) PCT No.: PCT/CN2015/089720
§ 371 (c)(1),
(2) Date: Jan. 21, 2016

(87) PCT Pub. No.: WO2016/161768
PCT Pub. Date: Oct. 13, 2016

(65) Prior Publication Data
US 2017/0092376 A1    Mar. 30, 2017

(30) Foreign Application Priority Data
Apr. 9, 2015   (CN) .......................... 2015 1 0164786

(51) Int. Cl.
*G09G 3/36*      (2006.01)
*G11C 19/28*     (2006.01)

(52) U.S. Cl.
CPC ......... *G11C 19/287* (2013.01); *G09G 3/3677* (2013.01); *G09G 2310/06* (2013.01); *G09G 2310/08* (2013.01); *G09G 2330/021* (2013.01)

(58) Field of Classification Search
CPC ......... G09G 2310/0286; G11C 19/18–19/188; G11C 19/28–19/287
(Continued)

(56) References Cited

U.S. PATENT DOCUMENTS

| | | | |
|---|---|---|---|
| 6,052,426 A | 4/2000 | Maurice | |
| 2010/0245298 A1 | 9/2010 | Chen et al. | |
| 2011/0058640 A1* | 3/2011 | Shang | G11C 19/184 377/64 |

FOREIGN PATENT DOCUMENTS

| | | |
|---|---|---|
| CN | 101064085 A | 10/2007 |
| CN | 101510443 A | 8/2009 |

(Continued)

OTHER PUBLICATIONS

The Fourth Chinese Office Action dated May 15, 2017; Appln. No. 201510164786.5.
(Continued)

*Primary Examiner* — Amr Awad
*Assistant Examiner* — Aaron Midkiff
(74) *Attorney, Agent, or Firm* — Ladas & Parry LLP

(57) ABSTRACT

There are provided a shift register unit, a strobe driving circuit, a display apparatus and a driving method for the shift register unit. The shift register unit comprises: an inputting module (10) configured to control a potential of the pulling-up control node according to a signal of the first signal input terminal; a pulling-up module (20) configured to output a present stage output signal from the present stage output terminal according to a signal of the second clock signal terminal and the potential of the pulling-up control node; a
(Continued)

pulling-down module (30) configured to pull down the potential of the pulling-up control node and the signal of the present stage output terminal to a low level according to a signal of the third clock signal terminal; a resetting module (40) configured to reset the potential of the pulling-up control node according to a signal of the second signal input terminal and pull down the signal of the present stage output terminal to a low level. Correspondingly, the pulling-down operation of the shift register unit is implemented in a simple manner, so that a number of TFTs as required, power consumption and wiring are reduced.

14 Claims, 9 Drawing Sheets

(58) Field of Classification Search
    USPC .......................................... 345/100; 377/64
    See application file for complete search history.

(56) References Cited

FOREIGN PATENT DOCUMENTS

| CN | 103956133 A | 7/2014 |
| CN | 104715733 A | 6/2015 |

OTHER PUBLICATIONS

Second Chinese Office Action dated Jul. 28, 2016; Appln. No. 201510164786.5
International Search Report and Written Opinion both dated Dec. 11, 2015; PCT/CN2015/089720.
First Chinese Office Action dated Feb. 1, 2016; Appln. No. 201510164786.5.

* cited by examiner

SHIFT REGISTER UNIT, DRIVING CIRCUIT AND METHOD, ARRAY SUBSTRATE AND DISPLAY APPARATUS

TECHNICAL FIELD

The present disclosure relates to a field of display technique, in particular to a shift register unit, a strobe driving circuit, an array substrate, a display apparatus and a driving method used for the shift register unit.

BACKGROUND

A liquid crystal display (LCD) has advantages of low radiation, small size and low power consumption and so on, and is applicable to electronic products such as a notebook computer, a flat panel TV or a mobile phone and the like widely. Typically, the liquid crystal display comprises a pixel array, a data driving circuit and a strobe driving circuit. When the liquid crystal display displays, the data driving circuit can input the input display data to data lines of a liquid crystal panel, and the strobe driving circuit converts the input clock signal into a voltage that controls turn-on/turn-off of pixels in the pixel array via a shift register, and applies the voltage to strobe lines of the liquid crystal panel progressively.

In order to further reduce production cost of liquid crystal display products, the existing strobe driving circuit is always designed by using a Gate Driver on Array (GOA), wherein a thin film transistor (TFT) strobe switch circuit is integrated on the array substrate of the display panel to form a scanning drive of the display panel. In this way, it not only reduces cost of products in two aspects of material cost and manufacturing process, but also makes the display panel has an aesthetic design.

In general, in the shift register of the GOA technique-based strobe driving circuit, clock signals always appear in pairs, for example, including a clock signal CLK and a reverse clock signal CLKB. The specific number of pairs may be one, two or three etc., i.e., a configuration having two clock signals, a configuration having four clock signals, and a configuration having six clock signals and so on. Generally, the shift register is disposed individually with a pulling-down control unit configured to control pulling-down of the shift register. After a puling-up unit of the shift register pulls up an output signal level of the shift register in accordance with a potential of a pulling-up control node, the pulling-down control unit controls and executes the pulling-down operation. The pulling-down control unit generally comprises a plurality of TFTs. In order to pull up and pull down the output signal level of the shift register, a plurality of TFTs are also necessary. The large number of TFTs cause wiring in the shift register become complicated. Therefore, it is desired to be capable of reducing the number of elements (in particular TFTs) in the shift register and simplifying the design of wiring of the shift register.

SUMMARY

The present disclosure provides a shift register unit, a strobe driving circuit, an array substrate, a display apparatus and a driving method for the shift register unit, which are capable of reducing a number of TFTs required by the shift register unit, decreasing power consumption of the shift register unit, and simplifying the wiring of the shift register unit.

According to one aspect, there is provided a shift register unit. The shift register unit can comprise an inputting module, a pulling-up module, a pulling-down module and a resetting module. The inputting module is connected to a first signal input terminal and a pulling-up control node, and is configured to control a potential of the pulling-up control node according to a signal of the first signal input terminal. The pulling-up module is connected to the pulling-up control node, a second clock signal terminal and a present stage output terminal, and is configured to output a present stage output signal from the present stage output terminal according to a signal of the second clock signal terminal and the potential of the pulling-up control node. The pulling-down module is connected to a third clock signal terminal, the pulling-up control node, the present stage output terminal and a power supply terminal, and is configured to pull down the potential of the pulling-up control node and the signal of the present stage output terminal to a low level according to a signal of the third clock signal terminal. The resetting module is connected to a second signal input terminal, the pulling-up control node, the present stage output terminal and the power supply terminal, and is configured to reset the potential of the pulling-up control node according to a signal of the second signal input terminal and pull down the signal of the present stage output terminal to the low level.

By combining with the first aspect, in an implementation of the first aspect, the shift register unit may further comprise an isolating module. The isolating module is connected to the second clock signal terminal and the pulling-up control node, and is configured to reduce signal fluctuation in the shift register unit caused by the signal of the second clock signal terminal.

By combining with the first aspect and the implementation as described above, in another implementation of the first aspect, the isolating modeling may be further connected to a first clock signal terminal, and may comprise: a second capacitor having a first terminal connected to the first clock signal terminal and a second terminal connected to the pulling-up control node; and a fourth capacitor having a first terminal connected to the second clock signal terminal and a second terminal connected to the pulling-up control node.

By combining with the first aspect and the implementation as described above, in another implementation of the first aspect, the isolating module may be further connected to the third clock signal terminal, and may comprise: a third capacitor having a first terminal connected to the third clock signal terminal and a second terminal connected to the pulling-up control node; and a fourth capacitor having a first terminal connected to the second clock signal terminal and a second terminal connected to the pulling-up control node.

By combining with the first aspect and the implementation as described above, in another implementation of the first aspect, the signal of the first cock signal terminal, the signal of the second clock signal terminal, and the signal of the third clock signal may be square wave signals, and are corresponding to a previous stage output signal, the present stage output signal and a next stage output signal respectively. The previous stage output signal is an output signal of a previous stage of shift register unit adjacent to the shift register unit. The next stage output signal is an output signal of a next stage of shift register unit adjacent to the shift register unit.

By combining with the first aspect and the implementation as described above, in another implementation of the first aspect, the power supply terminal may be connected to the second clock signal terminal, so that the signal of the second clock signal terminal is provided to the power supply terminal to pull down the potential of the pulling-up control node and the signal of the present stage output terminal.

By combining with the first aspect and the implementation as described above, in another implementation of the first aspect, the inputting module may comprise: a first transistor, whose first electrode and strobe electrode are connected to the first signal input terminal, and whose second electrode is connected to the pulling-up control node.

By combining with the first aspect and the implementation as described above, in another implementation of the first aspect, the pulling-up module may comprise: a first capacitor, whose first terminal is connected to the pulling-up control node; and a second transistor, having first electrode connected to the second clock signal terminal, strobe electrode connected to a second terminal of the first capacitor, and second electrode connected to the present stage output terminal.

By combining with the first aspect and the implementation as described above, in another implementation of the first aspect, the pulling-down module may comprise: a third transistor, having first electrode connected to the pulling-up control node, strobe electrode connected to the third clock signal terminal, and second electrode connected to the power supply terminal; and a fourth transistor, having first electrode connected to the present stage output terminal, strobe electrode connected to the third clock signal terminal, and second electrode connected to the power supply terminal.

By combining with the first aspect and the implementation as described above, in another implementation of the first aspect, the resetting module may comprise: a fifth transistor, having first electrode connected to the pulling-up control node, strobe electrode connected to the second signal input terminal, and second electrode connected to the power supply terminal; and a sixth transistor, having first electrode connected to the present stage output terminal, strobe electrode connected to the second signal input terminal, and second electrode connected to the power supply terminal.

According to a second aspect, there is provided a strobe driving circuit, comprising N stages of shift register units. The N stages of shift register units are first shift register unit to N-th shift register unit. Each of the shift register units is the shift register unit as described above, wherein N is a natural number. A first signal input terminal of each of second shift register unit to the N-th shift register unit is connected to an output terminal of a previous stage of shift register unit adjacent thereto. A second signal input terminal of each of the first shift register unit to (N−1)-th shift register unit is connected to an output terminal of a next stage of shift register unit adjacent thereto.

According to a third aspect, there is provided an array substrate, comprising the strobe driving circuit as described above.

According to a fourth aspect, there is provided a display apparatus, comprising the array substrate as described above.

According to a fifth aspect, there is provided a driving method for a shift register unit. The shift register unit comprises an inputting module, a pulling-up module, a pulling-down module, and a resetting module. The inputting module is connected to a first signal input terminal and a pulling-up control node. The pulling-up module is connected to the pulling-up control node, a second clock signal terminal and a present stage output terminal. The pulling-down module is connected to a third clock signal terminal, the pulling-up control node, the present stage output terminal and a power supply terminal. The resetting module is connected to a second signal input terminal, the pulling-up control node, the present stage output terminal and the power supply terminal. The driving method may comprise: in a first phase, the inputting module pulls up a potential of the pulling-up control node to a high level of the first signal input terminal through a signal of the first signal input terminal, and the pulling-up module stores the high level of the first signal input terminal; in a second phase, the pulling-up control node controls the pulling-up module to provide a high level of the second clock signal terminal to the present stage output terminal to output a present stage output signal; in a third phase, the pulling-down module pulls down the potential of the pulling-up control node and the signal of the present stage output terminal to a low level of the power supply terminal according to a signal of the third clock signal terminal; and in a fourth phase, the resetting module resets the potential of the pulling-up control node to the low level according to the signal of the second signal input terminal, and pulls down the signal of the present stage output terminal to the low level.

By combining with a fifth aspect, in an implementation of the fifth aspect, the shift register unit further comprises an isolating module. The isolating module is connected to a first clock signal terminal, the second clock signal terminal, the third clock signal terminal and the pulling-up control node, and is configured to reduce signal fluctuation in the shift register unit caused by signals of respective clock signal terminals. A signal of the first clock signal terminal, a signal of the second clock signal terminal, and a signal of the third clock signal are square wave signals, and are corresponding to a previous stage output signal, the present stage output signal and a next stage output signal respectively. The previous stage output signal is an output signal of a previous stage of shift register unit adjacent to the shift register unit, and the next stage output signal is an output signal of a next stage of shift register unit adjacent to the shift register unit.

In the technical solution of the shift register unit, the strobe driving circuit, the display apparatus and the driving method for the shift register unit according to embodiments of the present disclosure, the shift register may be implemented by using clock signals and TFTs, i.e., implementing the pulling-down operation of the shift register unit in a simple manner, so that the number of TFTs required by the shift register unit is reduced, power consumption of the shift register unit is decreased, and wiring in the shift register unit is simplified.

BRIEF DESCRIPTION OF THE DRAWINGS

In order to describe the technical solutions in embodiments of the present disclosure more clearly, figures needed to be used in describing the embodiment or the prior art will be simply introduced below. Obviously, the figures in below descriptions are just some embodiments of the present disclosure. Other figures may further be obtained according to these figures for those ordinary skilled in the art.

DETAILED DESCRIPTION

The technical solutions in embodiments of the present disclosure will be clearly and completely described by combining with the figures in the embodiments of the present disclosure. Obviously, the embodiments described below are just a part of embodiments of the present disclosure, but not all the embodiments of the present disclosure. Based on the embodiments of the present disclosure, all of the other embodiments obtained by those skilled in the art without paying any inventive labor belong to the scope sought for protection in the present disclosure.

Sources and drains of thin film transistors adopted in all of the embodiments of the present disclosure are symmetrical, and thus names of all of the sources and drains thereof can be exchanged with each other. Additionally, thin film transistors can be classified into N-type transistor or P-type transistor according to characteristics of the thin film transistors. In the embodiments of the present disclosure, when a N-type thin film transistor is used, its first electrode can be a source, second electrode can be a drain. The thin film transistors used in the embodiments of the present disclosure may be N-type transistor, or may be P-type transistor. The following embodiments are described by taking the all the thin film transistors being N-type transistor as an example, that is, the thin film transistor is turned on when a signal of a strobe electrode is at a high level. Additionally, in the case of the thin film transistor being the P-type transistor, the thin film transistor is turned on when the signal of the strobe electrode is at a low level, timing of a driving signal needs to be adjusted correspondingly.

Figure 1:
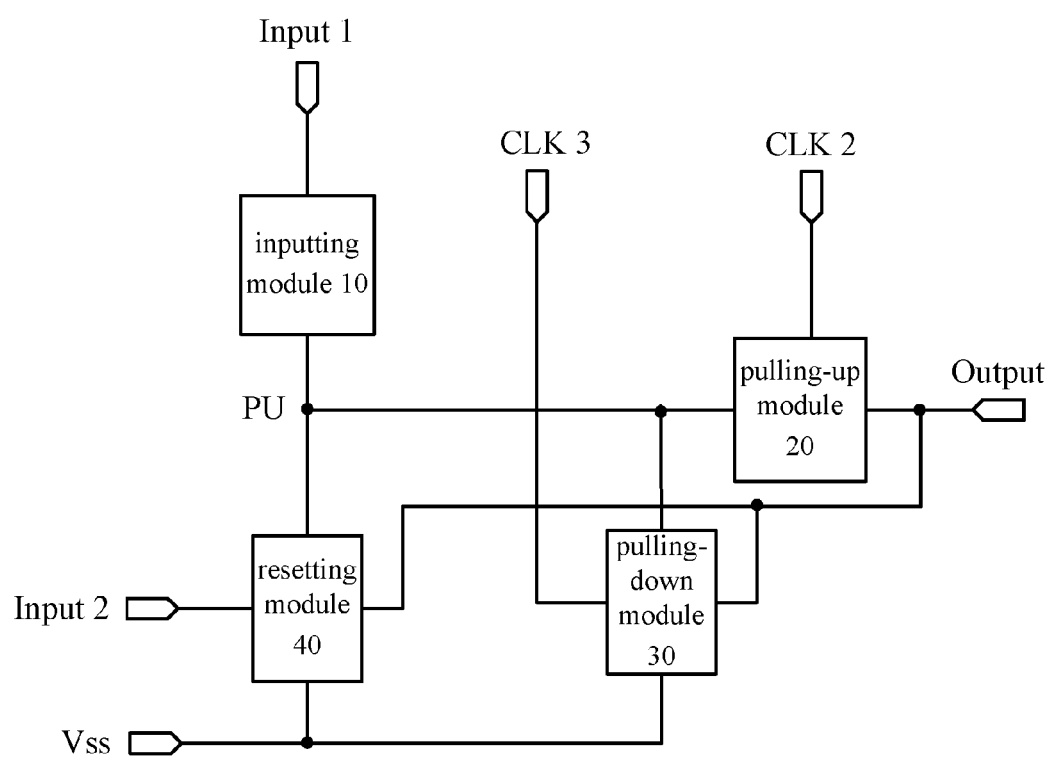
FIG. 1 is a block diagram schematically showing a module structure of a shift register unit according to an embodiment of the present disclosure.

FIG. 1 is a block diagram schematically showing a module structure of a shift register unit according to an embodiment of the present disclosure. The shift register unit is configured to convert an input clock signal into a voltage for controlling ON or OFF of respective rows of pixels and apply the voltage to a strobe line progressively. As shown in FIG. 1, a shift register unit 100 can comprise: an inputting module 10, a pulling-up module 20, a pulling-down module 30 and a resetting module 40.

The inputting module 10 is connected to a first signal input terminal Input1 and a pulling-up control node PU, and is configured to control a potential of the pulling-up control node PU according to a signal of the first signal input terminal Input1. The first signal input terminal Input1 is used to initiate shifting operation of the shift register unit 100. Typically, when the shift register unit 100 outputs a low level signal to control the row of pixels to be turned off, the first signal input terminal Input1 makes the shift register unit 100 prepare outputting a high level signal to control the row of pixels to be turned on. The pulling-up control node PU is a node used to control the pulling-up module 20. Typically, when a voltage of the pulling-up control node PU is at the high level, it can control the shift register unit 100 to output the high level signal.

The pulling-up module 20 is connected to the pulling-up control node PU, a second clock signal terminal CLK2 and an present stage output terminal Output, and is configured to output a present stage output signal from the present stage output terminal Output according to a signal of the second clock signal terminal CLK2 and the potential of the pulling-up control node PU. Typically, when the voltage of the pulling-up control node PU is at the high level, the pulling-up module 20 is enabled. The pulling-up module 20 for example outputs a signal of the second clock signal terminal CLK2 that is at the high level to the present stage output terminal Output. Correspondingly, the present stage output terminal Output is capable of outputting the high level signal to control the row of pixels to be turned on. The signal of the second clock signal terminal CLK2 is typically at the high level.

The signal of the second clock signal terminal CLK2 can be a square wave signal, and for example can correspond to an output of the shift register unit 100. Typically, in one clock period of the signal of the second clock signal terminal CLK2, when the signal of the second clock signal terminal CLK2 is a high level signal used to enable the pulling-up module 20, the output signal of the shift register unit 100 is a high level signal that enables the corresponding row of pixels; when the output signal of the shift register 100 is a low level signal that disables the corresponding row of pixels, the signal of the second clock signal terminal CLK2 is correspondingly a low level signal used to disable the pulling-up module 20.

In general, in multiple stages of shift register units, when a signal of an output terminal of a previous stage of shift register unit adjacent to the shift register unit 100 changes from a high level into a low level, a signal of the present stage output terminal of the shift register unit 100 changes from the high level into the low level, so that displaying of the row of pixels corresponding to the shift register unit 100 is initiated. Before the pulling-up module 20 outputs the high level signal, the inputting module 10 needs to pull up the potential of the puling-up control node PU. Correspondingly, the signal of the output terminal of the previous stage of shift register unit can be provided to the first signal input terminal Input1 of the inputting module 10, so that the potential of the pulling-up control node PU is pulled up before the pulling-up module 20 outputs a high level signal.

After outputting a high level signal for a specific period of time, the present stage output terminal Output converts the output signal into the low level signal according to requirements. The pulling-down module 30 is typically configured to pull down the signal of the present stage output terminal Output to a low level.

As shown in FIG. 1, the pulling-down module 30 is connected to a third clock signal terminal CLK3, the pulling-up control node PU, the present stage output terminal Output and a power supply terminal Vss, and is configured to pull down the potential of the pulling-up control node PU and the signal of the present stage output terminal Output to the low level according to a signal of the third clock signal terminal CLK3. The power supply terminal Vss for example outputs a constant low level signal. The signal of the third clock signal terminal CLK3 is used to initiate the pulling-down operation of the pulling-down module 30, so that the high level signal output by the present stage output terminal Output is pulled down to a low level signal of the power supply terminal Vss. The pulling-down module 30 can further pull down the potential of the pulling-up control node PU to a low level signal under a control of the signal of the third clock signal terminal CLK3.

The signal of the third clock signal terminal CLK3 can be a square wave signal, and for example can correspond to an output of a next stage of shift register unit adjacent to the shift register unit 100. Typically, in one clock period of the signal of the third clock signal terminal CLK3, when the signal of the third clock signal terminal CLK3 is a high level signal, an output signal of the next stage of shift register unit is a high level signal that enables the corresponding row of pixels; when the output signal of the next stage of shift register unit is a low level signal that disables the corresponding row of pixels, the signal of the third clock signal terminal CLK3 is a low level signal correspondingly.

The resetting module 40 in FIG. 1 is connected to a second signal input terminal Input2, the pulling-up control node PU, the present stage output terminal Output and the power supply terminal Vss, and is configured to reset the potential of the pulling-up control node PU according to a signal of the second signal input terminal Input2 and pull down the signal of the present stage output terminal to a low level. Typically, after the shift register unit 100 outputs a high level signal to control the row of pixels to display, the resetting module 40 makes the shift register unit 100 be reset to prepare for next time of initiation and control. Generally, in a multiple stages of shift register units, when the signal of the present stage output terminal of the shift register unit 100 changes from a high level into a low level, the signal of the output terminal of the next stage of shift register unit adjacent to the shift register unit 100 changes from a low level to a high level, so that displaying of the row of pixels corresponding to the next stage of shift register unit is initiated. Correspondingly, the signal of the output terminal of the next stage of shift register unit can be provided to the second signal input terminal Input2 to control operation of the resetting module 40.

In addition, according to the above description, it can be known that in one operation cycle of a clock signal, the signal of the second signal terminal CLK2 corresponds to the present stage output signal, and when both the signal of the second signal terminal CLK2 and the present stage output signal change from a high level into a low level, the signal provided by the power supply terminal Vss provides a level reference after pulling down for the pulling-down module, and provides a level reference after resetting for the resetting module. Correspondingly, the signal of the second clock signal terminal can be provided to the power supply terminal to pull down the potential of the pulling-up control node and the signal of the present stage output terminal, which can be realized by connecting the power supply terminal and the clock signal terminal. At this time, there is no need to provide a special low level signal for the power supply terminal Vss, but a low level signal is provided for the power supply terminal Vss by using a low level part of the second clock signal. Therefore, power supply lines in the shift register unit 100 are saved, and design of wiring in the shift register unit 100 is simplified.

After the shift register unit 100 outputs an enabling signal used to enable the corresponding row of pixels, the resetting module 40 and the pulling-down module 30 stop the enabling signal quickly and enter into a resetting state, so as to output the enabling signal next time. The resetting module 40 and the pulling module 30 avoid a previous display of the row of pixels corresponding to the shift register unit 100 from influencing a next display of the same.

In the technical solution of the shift register unit according to the embodiment of the present disclosure, the operation of the pulling-down module can be controlled by using the third clock signal, without a special pulling-down control module, that is, the pulling-down operation of the shift register unit is implemented in a simple manner. Correspondingly, the number of TFTs required by the shift register unit is reduced, the power consumption in the shift register unit is decreased, and the wiring in the shift register unit is simplified.

Figure 2:
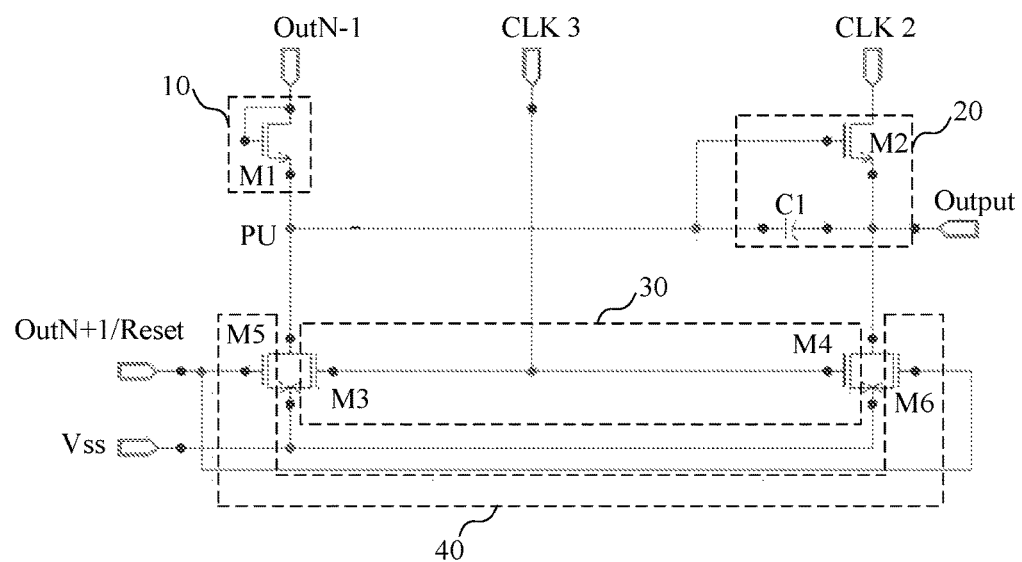
FIG. 2 is an equivalent circuit diagram schematically showing a specific implementation of a shift register unit in FIG. 1.

FIG. 2 is an equivalent circuit diagram schematically showing specific implementation of the shift register unit 100 in FIG. 1. In FIG. 2, specific implementation of respective modules of the shift register unit 100 is shown.

As shown in FIG. 2, the inputting module 10 comprises: a first transistor M1, whose first electrode and strobe electrode are connected to the first signal input terminal Input1, and whose second electrode is connected to the pulling-up control node PU. As described above, the first signal input terminal Input1 can be an output of the previous stage of shift register unit. Before the shift register unit 100 outputs a high level signal used to enable the corresponding row of pixels, a high level signal of the first signal input terminal Input1 turns on the first transistor M1, and transfers a high level signal output by the previous stage of shift register unit to the pulling-up control node PU, so as to raise the potential of the pulling-up control node PU. Herein, the inputting module 10 is implemented as the first transistor M1, and both the first electrode and the strobe electrode are connected to the first signal input terminal Input1. Alternatively, a control signal can be provided for the strobe electrode of first transistor M1, and this control signal can be provided by using other transistors. The specific implementation structure and control mode and so on of the inputting module 10 do not form a limitation to the embodiment of the present disclosure.

In the implementation of FIG. 2, the puling-up module 20 can comprise: a first capacitor C1, having first terminal connected to the pulling-up control node PU; and a second transistor M2, having first electrode connected to the second clock signal terminal CLK2, strobe electrode connected to a second terminal of the first capacitor C1, and second electrode connected to the present stage output terminal Output. In the process that the inputting module 10 raises the potential of the pulling-up control node PU, the first capacitor C1 is charged, and electric energy is stored in the first capacitor C1. After the potential of the pulling-up control node PU is raised, the second transistor M2 is turned on and the signal of the second clock signal terminal CLK2 is transferred to the present stage output terminal Output, so as to output the present stage output signal. The electricity storing function of the first capacitor C1 enables the second transistor M2 to maintain the high level of the present stage output signal for a desired period of time. The signal of the second clock signal terminal CLK2 can correspond to the output of the shift register unit 100. Herein, the first capacitor C1 is just an example, and the second transistor M2 can also be turned on by using other elements in correspondence to the present stage output signal.

After the present stage output terminal Output outputs the high level signal for a specific period of time, the pulling-down module 30 reduces the level of the present stage output signal, and reduces the level of the pulling-up control node PU, so that the pulling-up module 20 does not output a high level of the present stage output signal. The third clock signal terminal CLK3 for example can correspond to an output of the next stage of shift register unit adjacent to the shift register unit 100. As shown in FIG. 2, the pulling-down module 30 comprises a third transistor M3 and a fourth transistor M4.

A first electrode of the third transistor M3 is connected to the pulling-up control node PU, a strobe electrode thereof is connected to the third clock signal terminal CLK3, and a second electrode thereof is connected to the power supply terminal Vss. For example, when the signal of the third clock signal terminal CLK3 is at a high level, the third transistor M3 is turned on to connect the pulling-up control node PU to the power supply terminal Vss. Since the power supply terminal Vss is at the low level, the turn-on of the third transistor M3 reduces the level of the pulling-up controlling node PU, i.e., pulling down the level of the pulling-up controlling node PU to a level equal to or approximate to the low level.

A first electrode of the fourth transistor M4 is connected to the present stage output terminal Output, a strobe electrode thereof is connected to the third clock signal terminal CLK3, and a second electrode thereof is connected to the power supply terminal Vss. For example, when the signal of the third clock signal terminal CLK3 is at a high level, the fourth transistor M4 is turned on to connect the present stage output terminal Output to the power supply terminal Vss. That is, the turn-on of the fourth transistor M4 reduces a level of the present stage output terminal Output, i.e., puling down the level of the present stage output terminal Output to a level equal to or approximate to the low level.

The pulling-down module 30 is just an example, and it may also have other configuration. For example, a transistor connected in parallel with the fourth transistor M4 can also be added to the pulling-down module 30, so that the level of the present stage output signal can be reduced more quickly. The first electrode of the transistor connected in parallel is connected to the present stage output terminal Output, a strobe electrode thereof is connected to the third clock signal terminal CLK3, and a second electrode thereof is connected to the power supply terminal Vss.

The resetting module 40 in FIG. 2 comprises a fifth transistor M5 and a sixth transistor M6. A first electrode of the fifth transistor M5 is connected to the pulling-up control node PU, a strobe electrode thereof is connected to the second signal input terminal Input2, and a second electrode thereof is connected to the power supply terminal Vss. A first electrode of the sixth transistor M6 is connected to the present stage output terminal Output, a strobe electrode thereof is connected to the second signal input terminal Input2, and a second electrode thereof is connected to the power supply terminal Vss. The second signal input terminal Input2 provides a reset signal Reset used to reset the shift register unit 100. As described above, a signal OutN of the output terminal of the next stage of shift register unit can be provided to the second signal input terminal Input2, that is, the reset signal Reset is the signal OutN of the output terminal of the next stage of shift register unit.

Typically, when the reset signal Reset is at a high level, the fifth transistor M5 is turned on to connect the pulling-up control node PU to the power supply terminal Vss, and the sixth transistor M6 is turned on to connect the present stage output terminal Output to the power supply terminal Vss. Since the power supply terminal Vss is at a low level, the turn-on of the fifth transistor M5 and the sixth transistor M6 reduces the level of the pulling-up control node PU. That is, the resetting module 40 performs resetting operation on the shift register unit according to the reset signal Reset. After the shift register unit 100 outputs a high level signal to control a row of pixels to display, the resetting module 40 makes the shift register unit 100 reset to prepare for next time of initiation and control. The above described resetting module 40 is just an example, and it may also have other configuration. For example, a transistor connected in parallel with the fifth transistor M5 can be added to the resetting module 40, so that the level of the present stage output signal can be reduced more quickly.

After the shift register unit 100 outputs an enabling signal that enables the corresponding row of pixels, the resetting module 40 and the pulling-down module 30 stop the enabling signal quickly and enter into a resetting state, so as to be used for outputting the enabling signal next time. The resetting module 40 and the pulling-down module 30 avoid a previous display of the row of pixels corresponding to the shift register unit 100 from influencing a next display of the same.

Figure 3:
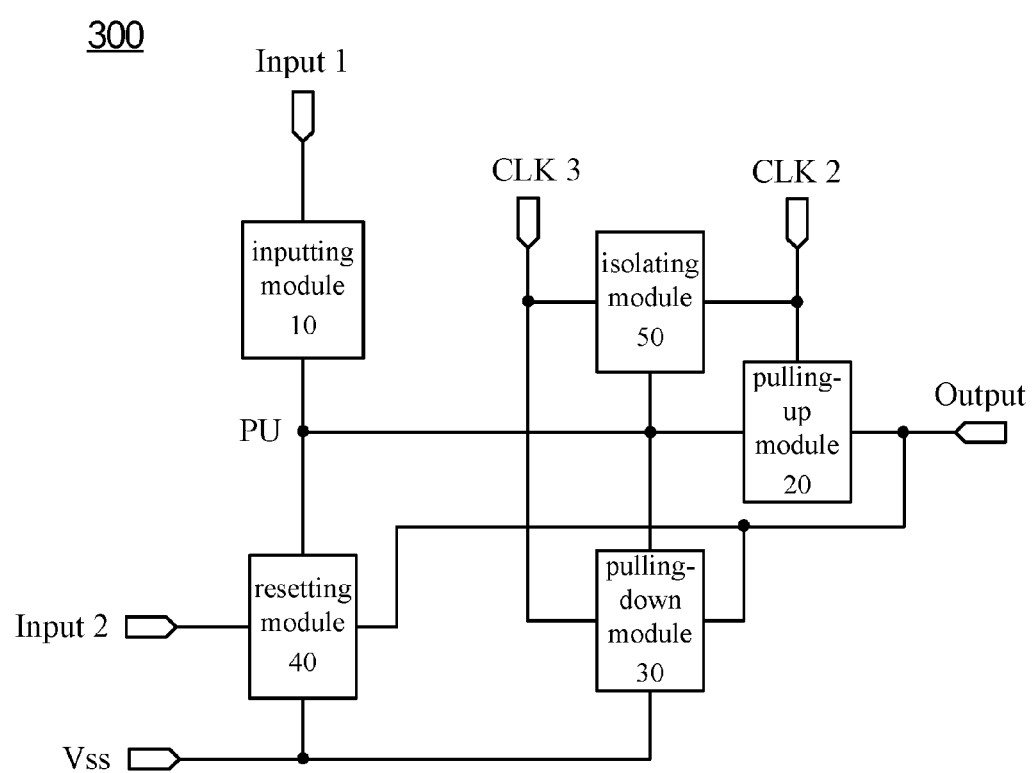
FIG. 3 is a block diagram schematically showing a module structure of another shift register unit according to an embodiment of the present disclosure.

FIG. 3 is a block diagram schematically showing a module structure of another shift register unit 300 according to an embodiment of the present disclosure. In FIG. 3, modules the same as those in the shift register unit 100 in FIG. 1 are represented with the same reference numbers. The inputting module 10, the pulling-up module 20, the pulling-down module 30 and the resetting module 40 in FIG. 3 are corresponding to the respective modules in FIG. 1, and can refer to the above description given by combining with FIG. 1.

Compared with the shift register unit 100 in FIG. 1, a shift register unit 300 in FIG. 3 further comprises an isolating module 50. The isolating module 50 is connected to the second clock signal terminal CLK2, the third clock signal terminal CLK3 and the pulling-up control node PU, and is configured to reduce signal fluctuation in the shift register unit caused by the signal of the second clock signal terminal CLK2 or the signal of the third clock signal terminal CLK3. A clock signal of the second clock signal terminal CLK2 would have a change of amplitude in each clock cycle. The change of amplitude may result in signal fluctuation in the wiring of the shift register unit, such that the operation of the shift register unit is affected. Likewise, an amplitude change of a clock signal of the third clock signal terminal CLK3 also causes signal fluctuation in the wiring of the shift register unit, such that the operation of the shift register unit is affected. For example, when the signal of the pulling-up control node PU fluctuates due to the clock signal, fluctuation of the present stage output signal may occur. Herein, signal fluctuation in the shift register unit caused by the respective clock signals is reduced by the isolating module 50.

Figure 4:
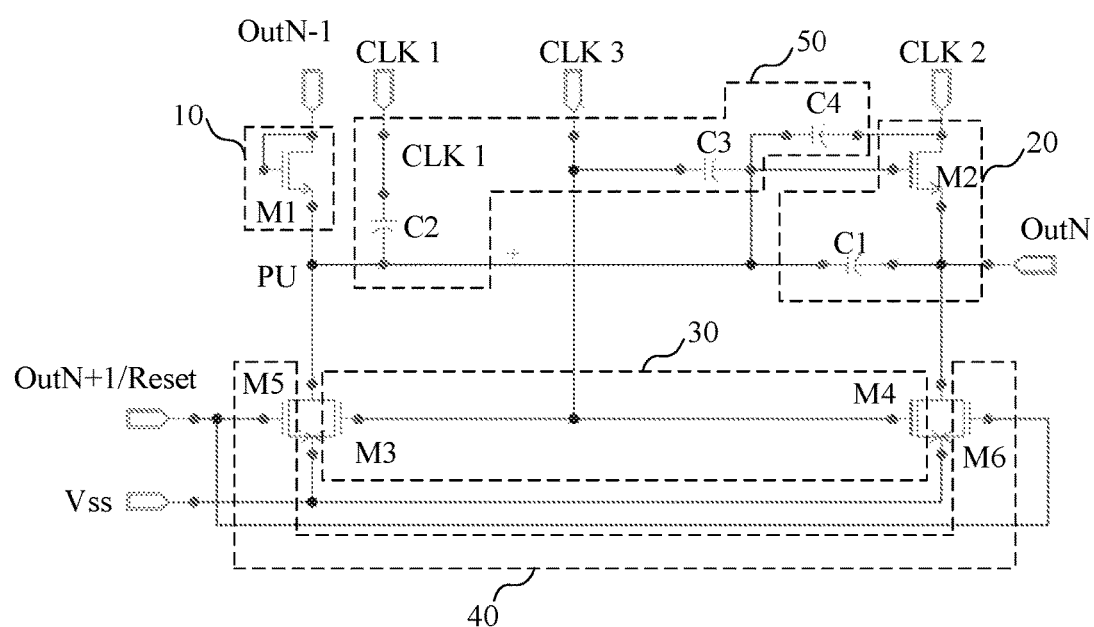
FIG. 4 is an equivalent circuit diagram schematically showing a specific implementation of another shift register unit in FIG. 3.

FIG. 4 is an equivalent circuit diagram schematically showing a specific implementation of another shift register unit in FIG. 3. In FIG. 4, elements the same as those in the shift register unit in FIG. 2 are represented with the same reference numbers, and can refer to the description given by combining with FIG. 2. FIG. 4 particularly shows a structure of the isolating module 50 in FIG. 3 and its connecting relationship with other elements in FIG. 2.

As shown in FIG. 4, the isolating module 50 is further connected to the first clock signal terminal CLK1, and comprises a second capacitor C2, a third capacitor C3, and a fourth capacitor C4. A first terminal of the second capacitor C2 is connected to the first clock signal terminal CLK1, and a second terminal thereof is connected to the pulling-up control node PU. A first terminal of the third capacitor C3 is connected to the third clock signal terminal CLK3, a second terminal thereof is connected to the pulling-up control node PU. A first terminal of the fourth capacitor C4 is connected to the second clock signal terminal CLK2, and a second terminal thereof is connected to the pulling-up control node PU. The second capacitor C2 and the fourth capacitor C4 are used to avoid the second clock signal terminal CLK2 from influencing the shift register unit. The second capacitor C2 and the third capacitor C3 are used to avoid the third clock signal terminal CLK3 from influencing the shift register unit. In practice, selection can be made appropriately according to the requirements. For example, the isolating module 50 may comprise only the second capacitor C2 and the fourth capacitor C4, or may comprise only the second capacitor C2 and the third capacitor C3.

The first clock signal terminal CLK1 is connected to the pulling-up control node PU via the second capacitor, and the second clock signal terminal CLK2 is connected to the pulling-up control node PU via the fourth capacitor C4. In a same clock cycle, when the signal of the second clock signal terminal CLK2 changes from high to low, the signal of the first clock signal terminal CLK1 can be made to change from low to high oppositely. This opposite change can compensate for the influence of the second clock signal on the signal of the pulling-up control node PU. When the signal of the second clock signal terminal CLK2 changes from low to high, the signal of the first clock signal terminal CLK1 can be made to change from high to low oppositely.

The first clock signal terminal CLK1 is connected to the pulling-up control node PU via the second capacitor C2, and the third clock signal terminal CLK3 is connected to the pulling-up control node PU via the third capacitor C3. In a same clock cycle, when the signal of the third clock signal terminal CLK3 changes from high to low, the signal of the first clock signal terminal CLK1 can be made to change from low to high oppositely. This opposite change can compensate for a influence of the third clock signal on the signal of the pulling-up control node PU. Likewise, when the signal of the third clock signal terminal CLK3 changes from low to high, the signal of the first clock signal terminal CLK1 can be made to change from high to low oppositely.

As described above, the signal of the second clock signal terminal and the signal of the third clock signal can correspond to the present stage output signal and the next stage output signal respectively. At this time, the signal of the first clock signal terminal can correspond to the previous stage output signal. The previous stage output signal is an output signal of the previous stage of shift register unit adjacent to the shift register unit.

Figure 5:
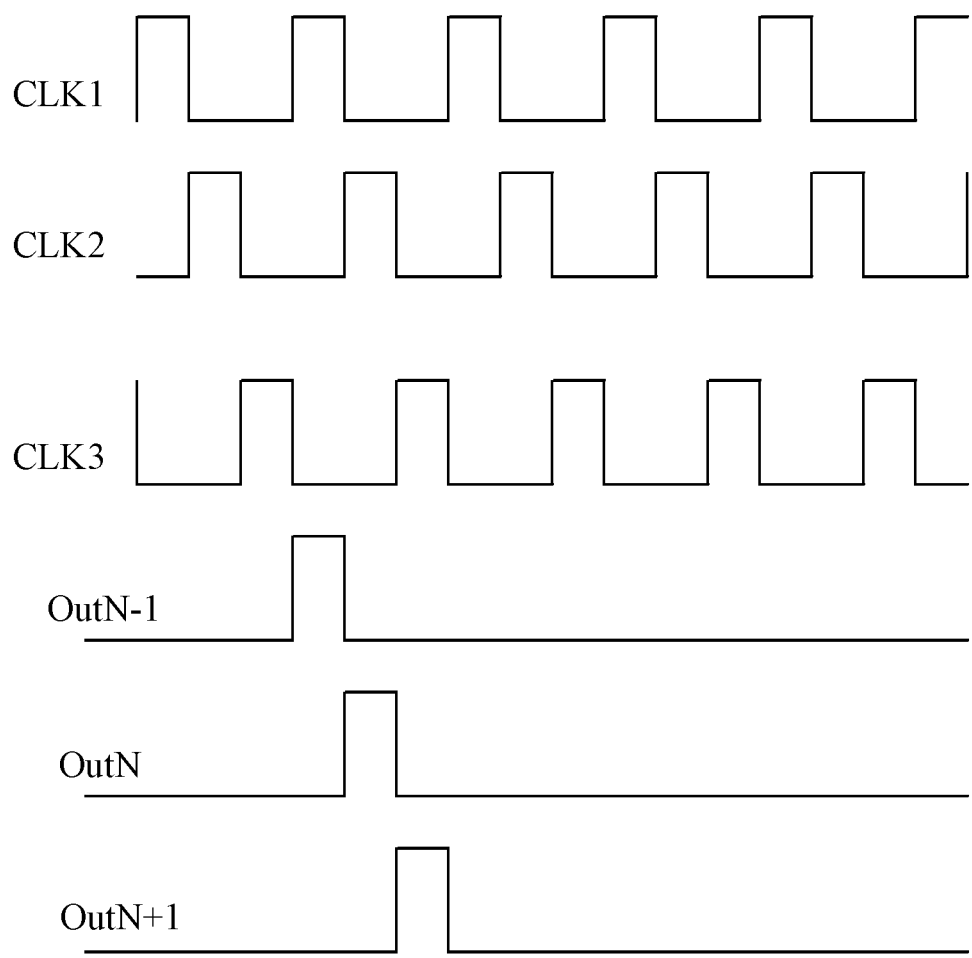
FIG. 5 is a waveform diagram schematically showing an operation timing of a shift register unit according to an embodiment of the present disclosure.

FIG. 5 is a waveform diagram schematically showing operation timing of the shift register unit in FIG. 4. FIG. 5 shows the signal of the first clock signal terminal CLK1, the signal of the second clock signal terminal CLK2, and the signal of the third clock signal terminal CLK3, the previous stage output signal OutN−1 of the first signal input terminal Input1, the present stage output signal OutN, and the next stage output signal OutN+1 of the second signal input terminal Input 2. The previous stage output signal is an output signal of the previous stage of shift register unit adjacent to the shift register unit. The next stage output signal is an output signal of the next stage of shift register unit adjacent to the shift register unit.

It can be seen from FIG. 5 that the signal of the first clock signal terminal CLK1, the signal of the second clock signal terminal CLK2, and the signal of the third clock signal terminal CLK3 are square wave signals, and have a difference of high level duration in one cycle successively. That is, in one clock cycle, the signals of the first clock signal terminal to third clock signal terminal are at a high level in sequence.

In one clock cycle, the signal of the first clock signal terminal CLK1 corresponds to the previous stage output signal OutN−1; the signal of the second clock signal terminal CLK2 corresponds to the present stage output signal OutN; and the signal of the third clock signal terminal CLK3 corresponds to the next stage output signal OutN+1. For example, in one clock cycle of the signal of the first clock signal terminal CLK1, when the signal of the first clock signal terminal CLK1 is a high level signal used to enable the output, the output signal of the previous stage of shift register unit is a high level signal that enables the corresponding row of pixels; when the signal of the first clock signal terminal CLK1 is the low level signal used to disable the output, the output signal of the previous stage of shift register unit is a low level signal that disables the corresponding row of pixels.

As shown in FIG. 5, when the signal of the second clock signal terminal CLK2 changes from low to high, the signal of the first clock signal terminal CLK1 changes from high to low oppositely, so that the influence of signal fluctuation of the second clock signal terminal on the output signal of the present stage of shift register unit can be reduced effectively; when the signal of the third clock signal terminal CLK3 changes from high to low, the signal of the first clock signal terminal CLK1 changes from low to high oppositely, so that the influence of signal fluctuation of the third clock signal terminal CLK3 on the output signal of the present stage of shift register unit can be reduced effectively.

Figure 6:
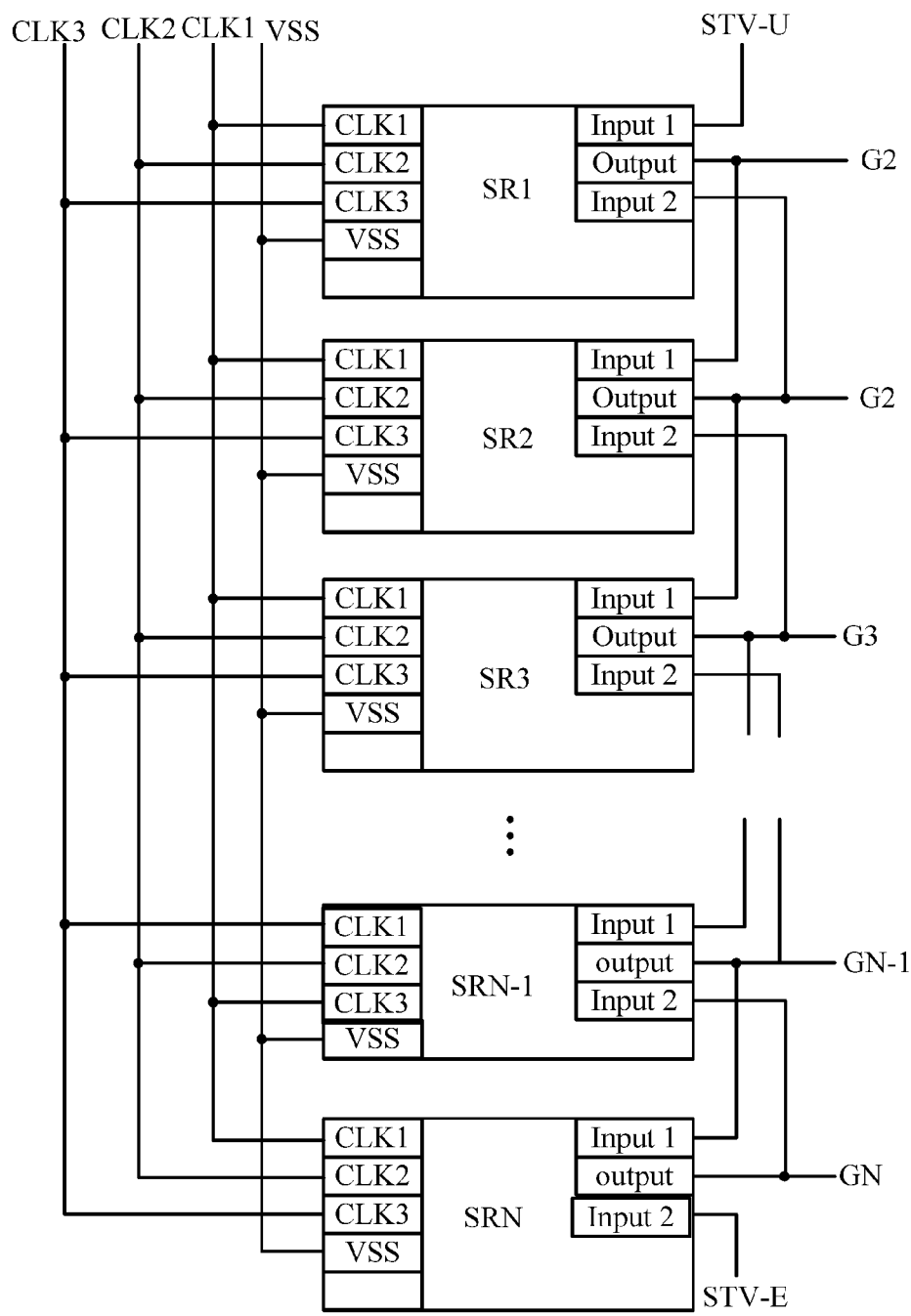
FIG. 6 is a block diagram schematically showing a structure of a strobe driving circuit according to an embodiment of the present disclosure.

FIG. 6 is a block diagram schematically showing a structure of a strobe driving circuit 600 according to an embodiment of the present disclosure. The strobe driving circuit 600 comprises multiple stages of shift register units, i.e., SR1, SR2, SR3, . . . , SRN−1, SRN. Each of the multiple stages of shift register units can adopt the structures described above.

As shown in FIG. 6, each stage of shift register unit has three clock input terminals CLK1, CLK2, and CLK3 and a power supply terminal Vss. The clock signals of the three clock input terminals can be for example square wave signals as shown in FIG. 5. The power supply terminal Vss is used to input a low level signal, so that the pulling-down operation and the resetting operation are performed when the high level output of the shift register unit is ended.

As for other shift register unit SRn except the first stage of shift register unit and the last stage of shift register unit, an output terminal of a previous stage of shift register unit SRn−1 is connected to the first signal input terminal Input1 of the shift register unit SRn, and an output terminal of a next stage of shift register unit SRn+1 is connected to the second signal input terminal Input2 of the shift register unit SRn, where n is a natural number, and n is greater than 1 and smaller than N.

A scan starting signal STV-U is input to a first signal input terminal Input1 of the first stage of shift register unit SR0 of the respective stages of shift register units, and the present stage signal output terminal Output of the respective stages of shift register units (SR1, SR2, SR3, . . . , SRN−1, SRN) output a scanning signal to strobe lines (G1, G2, G3, . . . , GN−1, GN) corresponding thereto sequentially. A scan ending signal STV-E can be input to the second signal input terminal Input2 of the last stage of shift register unit SRN. The scan ending signal STV-E can be an output Output(GN) of the last stage of shift register unit SRN. Through controlling the first signal input terminal Input1 of the first stage of shift register unit SR1 and the second signal input terminal Input2 of the last stage of shift register unit SRN, different scanning modes such as unidirectional scanning, bilateral scanning and so on can be realized by using the strobe driving circuit 600.

Figure 7:
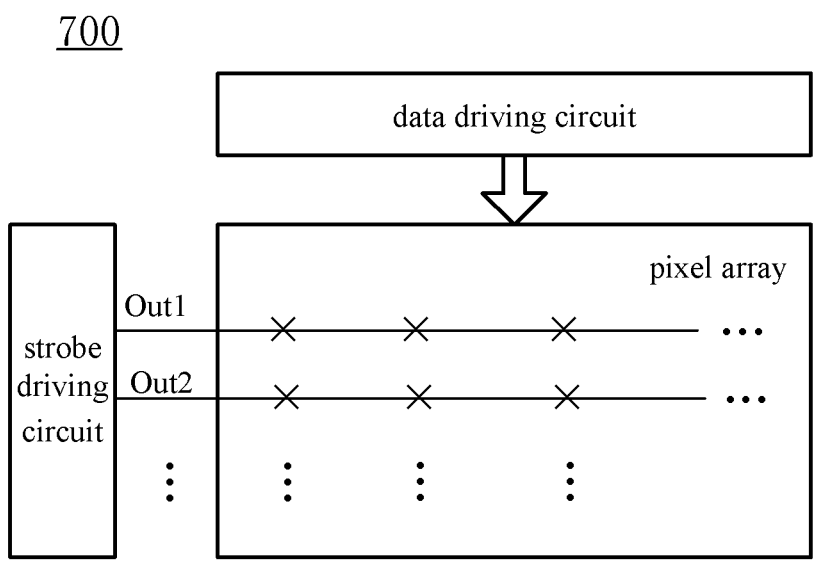
FIG. 7 is a block diagram schematically showing a structure of an array substrate according to an embodiment of the present disclosure.

The strobe driving circuit according to the embodiment of the present disclosure can be applicable to various kinds of apparatuses or modules. FIG. 7 is a block diagram schematically showing a structure of an array substrate 700 according to an embodiment of the present disclosure. As shown in FIG. 7, the array substrate can comprise: a pixel arrays; a strobe driving circuit according to the embodiment of the present disclosure configured to generate strobe driving signals corresponding to respective rows of pixels one by one; a data driving circuit configured to provide data for the respective rows of pixels which are strobe. When a strobe driving signal output by the strobe driving circuit in FIG. 7 drives a specific row in the pixel array, the pixels in the specific rows are enabled, so as to be capable of receiving data signal from the data driving circuit and reversing it. FIG. 7 is just an exemplary structure of the array substrate, and it may further comprise other components, for example, a base substrate, an insulated isolating layer and so on. Those skilled in the art can design an appropriate array substrate comprising the strobe driving circuit according to the embodiment of the present disclosure as required.

Figure 8:
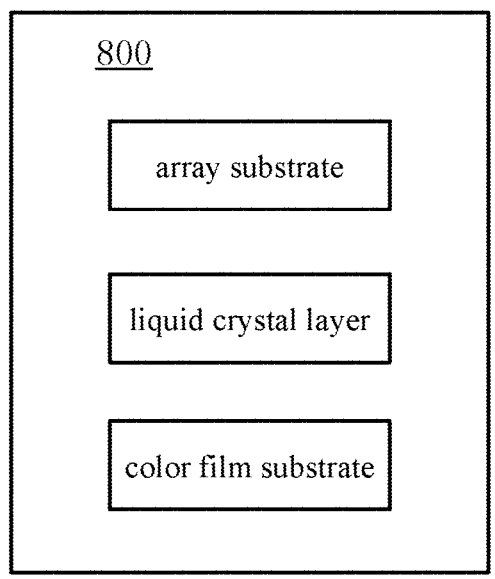
FIG. 8 is a block diagram schematically showing a structure of a display apparatus according to an embodiment of the present disclosure.

FIG. 8 is a block diagram schematically showing a display apparatus 800 according to an embodiment of the present disclosure. The display apparatus can be for example a thin film transistor liquid crystal display (TFT LCD), an active matrix organic light emitting diode display (AMOLED), a twisted nematic (TN) display, or a wide-viewing angle and wide screen liquid crystal display (ADS) and so on. By taking the thin film transistor liquid crystal display as an example, the display apparatus can comprise: the array substrate as described above; a color film substrate disposed with the array substrate in pairs; a liquid crystal layer arranged between the array substrate and the color film substrate. In addition, the display apparatus may further comprise a backlight unit configured to generate a backlight.

In the technical solution of the array substrate and display apparatus according to the embodiment of the present disclosure, the operation of the pulling-down module can be controlled by using the third clock signal, without a specific signal for the pulling-down control module, so as to implement the pulling-down operation of the shift register unit in a simple manner. Correspondingly, the number of TFTs required by the array substrate and display apparatus is reduced, and power consumption and wiring in the array substrate and display apparatus are decreased.

Figure 9:
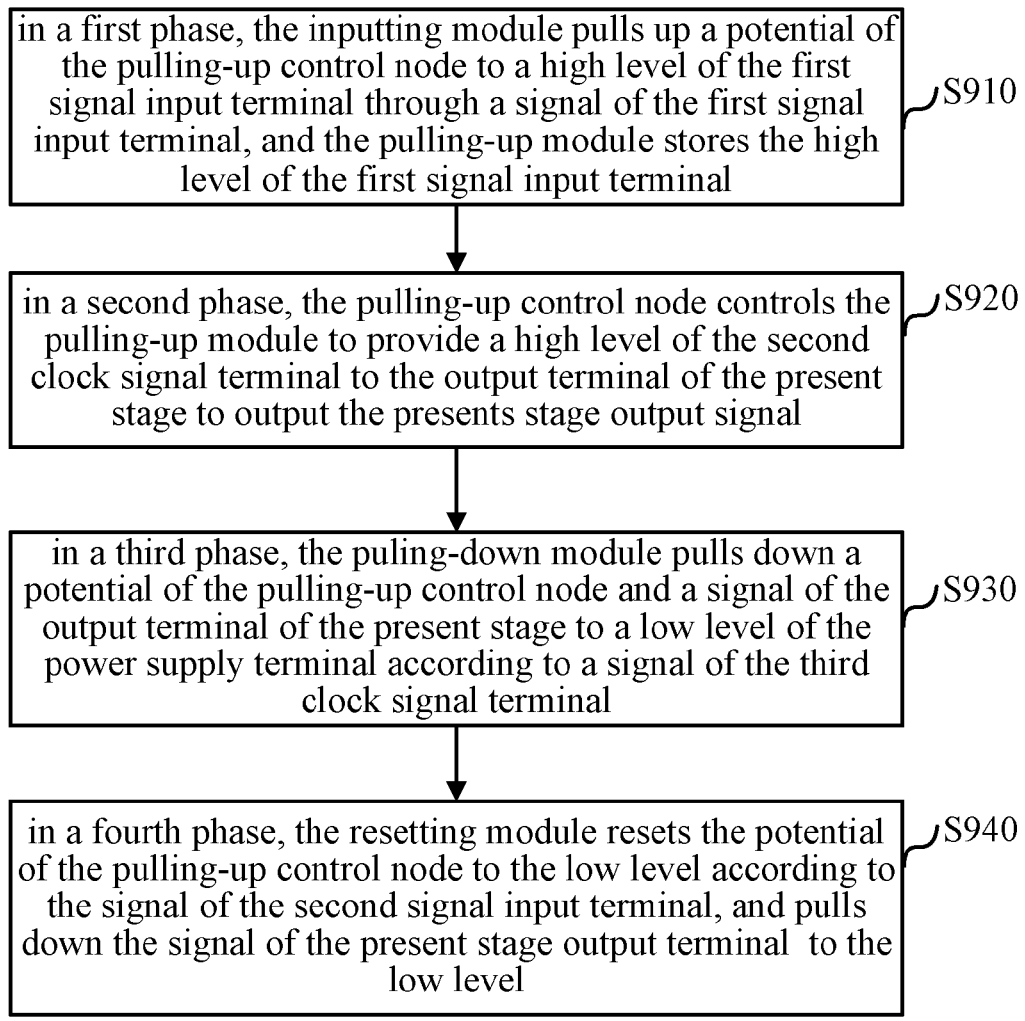
FIG. 9 is flowchart schematically showing a driving method for a shift register unit according to an embodiment of the present disclosure.

FIG. 9 is a flowchart schematically showing a driving method 900 for a shift register unit according to an embodiment of the present disclosure. The shift register unit to which the driving method 900 is applied can comprise an inputting module, a pulling-up module, a pulling-down module, and a resetting module. The inputting module is connected to a first signal input terminal and a pulling-up control node. The pulling-up module is connected to the pulling-up control node, a second clock signal terminal and a present stage output terminal. The pulling-down module is connected to a third clock signal terminal, the pulling-up control node, the present stage output terminal and a power supply terminal. The resetting module is connected to a second signal input terminal, the pulling-up control node, the present stage output terminal and the power supply terminal. The structure of the shift register unit can be referred to diagrams of FIGS. 1 and 2 as well as related description thereof.

As shown in FIG. 9, the driving method can comprise: in a first phase, the inputting module pulls up a potential of the pulling-up control node to a high level of the first signal input terminal through a signal of the first signal input terminal, and the pulling-up module stores the high level of the first signal input terminal (S910); in a second phase, the pulling-up control node controls the pulling-up module to provide a high level of the second clock signal terminal to the present stage output terminal to output a presents stage output signal (S920); in a third phase, the puling-down module pulls down the potential of the pulling-up control node and the signal of the present stage output terminal to a low level of the power supply terminal according to a signal of the third clock signal terminal (S930); and in a fourth phase, the resetting module resets the potential of the pulling-up control node to a low level according to a signal of the second signal input terminal, and pulls down the signal of the present stage output terminal to the low level (S940). Respective steps will be further described below by combining with FIGS. 1, 2 and 5.

In step S910, shifting operation of the shift register unit is initiated. The output signal OutN−1 of the previous stage of shift register unit (hereinafter referred to as the previous stage output signal) is provided to the first signal input terminal. As shown in FIG. 5, when the previous stage output signal OutN−1 is at a high level, step S910 starts to be executed. By taking the inputting module having the structure as shown in FIG. 2 as an example, when the previous stage output signal OutN−1 is at a high level, the first transistor M1 is turned on, and the previous stage output signal OutN−1 that is at the high level is transferred to the pulling-up control node PU, to raise the potential of the pulling-up control node PU. The potential of the pulling-up control node PU is raised to charge the first capacitor C1 in the pulling-up module in FIG. 2 until the high level of the previous stage output signal OutN−1 is ended. That is, the pulling-up module utilizes the first capacitor C1 to store the high level of the first signal input terminal. The first phase is typically corresponding to a period of time during which the previous stage output signal OutN−1 in FIG. 5 is at the high level.

The second phase is typically corresponding to a period of time during which the present stage output signal OutN in FIG. 5 is at a high level. After the potential of the pulling-up control node PU is raised, the second transistor M2 in the pulling-up module in FIG. 2 is turned on and transfers the high level signal of the second clock signal terminal CLK2 to the present stage output terminal Output, to output the high level of the present stage output signal. During the period of time of maintaining the high level of the signal of the second clock signal terminal CLK2, the outputted present stage output signal enables a row of the pixels corresponding to the shift register unit, so that the pixels receive data to display.

The third phase is typically corresponding to a period of time during which the next stage output signal OutN+1 in FIG. 5 is at the high level. In this phase, the shift register unit stops outputting the high level signal, so as to stop the display operation of the row of pixels corresponding to the shift register unit. That is, the present stage output signal outN is at a low level in the third phase. The pulling-down module pulls down the potential of the pulling-up control node and the signal of the present stage output terminal to the low level of the power supply terminal according to the signal of the third clock signal terminal CLK3 in FIG. 5.

As shown in FIG. 5, the signal of the third clock signal terminal CLK3 is at the high level in the third phase. The signal of the third clock signal terminal CLK3 enables the pulling-down module to perform the pulling-down operation. In the pulling-down module comprising the third transistor M3 and the fourth transistor M4 as shown in FIG. 2, in a period of time during which the signal of the third clock signal terminal CLK3 is at the high level, the third transistor M3 is turned on to connect the pulling-up control node PU to the power supply terminal; the fourth transistor M4 is turned on to connect the present stage output terminal Output to the power supply terminal. Since the power supply terminal Vss is at a low level, the turn-on of the third transistor M3 and the fourth transistor M4 decreases the level of the pulling-up control node PU and the level of the output terminal Output respectively.

The fourth phase is typically corresponding to a period of time during which the next stage output signal OutN+1 in FIG. 5 is at a high level. The third phase is the operation of the pulling-down module in the duration that the next stage output signal OutN+1 is at a high level. The fourth phase is the operation of the resetting module in a duration that the next stage output signal OutN+1 is at the high level. In the fourth phase, the resetting module resets the potential of the pulling-up control node to the low level according to the signal of the second signal input terminal, and pulls down the signal of the present stage output terminal to the low level.

In the resetting module comprising the fifth transistor M5 and the sixth transistor M6 as shown in FIG. 2, in a duration that the signal of the third clock signal terminal CLK3 is at a high level, the fifth transistor M5 is turned on to connect the pulling-up control node PU to the power supply terminal; the sixth transistor M6 is turned on to connect the present stage output terminal Output to the power supply terminal. Since the power supply terminal Vss is at the low level, the turn-on of the fifth transistor M5 and the sixth transistor M6 decreases the level of the pulling control node PU and the level the output terminal Output respectively. That is, the resetting module performs the resetting operation on the shift register unit according to the reset signal Reset (for example, the next state output signal OutN+1 as described above), which make the shift register unit prepare for next time of initiation and control.

After the shift register unit outputs an enabling signal used to enable the corresponding row of pixels, operations in steps S930 and S940 make the shift register unit stop the enabling signal rapidly and enter into the resetting state, so as to be used for outputting the enabling signal next time. Correspondingly, a previous display of the row of pixels corresponding to the shift register unit may be avoided from influencing a next display of the same.

The shift register unit to which the driving method 900 is applied can further comprise an isolating module. The configuration of the isolating module and its connecting relationship with other modules can refer to diagrams of FIGS. 3 and 4 as well as their related description. In order to reduce signal fluctuation in the shift register unit caused by the signals of the second and third clock signal terminals by using the isolating module, the isolating module can further be connected to the first clock signal terminal. The signal fluctuation of the first clock signal terminal can be reverse to the signal fluctuation of the second clock signal, so as to reduce the influence of the signal fluctuation of the second clock signal terminal. The signal fluctuation of the first clock signal terminal can be reverse to the signal fluctuation of the third clock signal terminal, so as to reduce the influence of the signal fluctuation of the third clock signal terminal.

As shown in FIG. 5, the signal of the first clock signal terminal can be a square wave signal, and corresponds to the previous stage output signal. The previous stage output signal is an output signal of the previous stage of shift register unit adjacent to the shift register unit. The signal of the second clock signal terminal corresponds to the present stage output signal. The signal of the third clock signal terminal corresponds to the next stage output signal. The next stage output signal is an output signal of the next stage of shift register unit adjacent to the shift register unit.

In the technical solution of the driving method for the shift register unit according to the embodiment of the present disclosure, the operation of the pulling-down module can be controlled by using the third clock signal, without a specific signal for pulling-down control module, i.e., implementing the pulling-down operation of the shift register unit in a simple manner. Correspondingly, the number of TFTs required by the shift register unit is reduced, and the power consumption and wiring in the shift register unit is decreased. In addition, the influence of signal fluctuation of the respective clock signals can be reduced by using the isolating unit and the signal of the first clock signal terminal.

Those skilled in the art can know clearly that, for the purpose of convenient and brief description, the specific implementation and structure of the shift register unit to which the driving method described above is applied can refer to the diagrams and operations in the embodiments of the shift register unit described by combing FIGS. 1 and 4, and thus no further details are given herein.

In the embodiments provided in the present disclosure, it shall be understood that the apparatus and method in the disclosure can be implemented in other manners. For example, the apparatus embodiment described above is just illustrative. A part of steps in the method embodiment can be recombined.

The above descriptions are just specific implementation of the present disclosure, but the protection scope of the present disclosure is not limited thereto. Any alternation or replacement that can be easily conceived by those skilled in the art who are familiar with the technical field within the technical scope of the present disclosure shall be included in the protection scope of the present disclosure. Therefore, the protection scope of the present disclosure shall be subjected to the protection scope of the Claims.

The present application claims the priority of a Chinese patent application No. 201510164786.5 filed on Apr. 9, 2015. Herein, the content disclosed by the Chinese patent application is incorporated in full by reference as a part of the present disclosure.

What is claimed is:
1. A shift register unit, comprising:
an inputting circuit connected to a first signal input terminal and a pulling-up control node, and configured to control a potential of the pulling-up control node according to a signal of the first signal input terminal;
a pulling-up circuit connected to the pulling-up control node, a second clock signal terminal and a present stage output terminal, and configured to output a present stage output signal from the present stage output terminal according to a signal of the second clock signal terminal and the potential of the pulling-up control node;

a pulling-down circuit connected to a third clock signal terminal, the pulling-up control node, the present stage output terminal and a power supply terminal, and configured to pull down the potential of the pulling-up control node and the signal of the present stage output terminal to a low level according to a signal of the third clock signal terminal; and a resetting circuit connected to a second signal input terminal, the pulling-up control node, the present stage output terminal and the power supply terminal, and configured to reset the potential of the pulling-up control node according to a signal of the second signal input terminal and pull down the signal of the present stage output terminal to a low level; and an isolating circuit connected to a first clock signal terminal, the second clock signal terminal, the third clock signal terminal and the pulling-up control node, and configured to reduce signal fluctuation in the shift register unit caused by signals of respective clock signal terminals, wherein the pulling-down circuit comprises:

a third transistor, having first electrode connected to the pulling-up control node, strobe electrode connected to the third clock signal terminal, and second electrode directly connected to the power supply terminal; and a fourth transistor, having first electrode connected to the present stage output terminal, strobe electrode connected to the third clock signal terminal, and second electrode directly connected to the power supply terminal, wherein the isolating circuit is further connected to a first clock terminal, and comprises:

a second capacitor having a first terminal directly electrically connected to the first clock signal terminal and a second terminal directly electrically connected to the pulling-up control node; and a fourth capacitor having a first terminal directly electrically connected to the second clock signal terminal and a second terminal directly electrically connected to the pulling-up control node.

2. The shift register unit according to claim 1, wherein the isolating circuit is further connected to the third clock signal terminal, and comprises:

a third capacitor having a first terminal connected to the third clock signal terminal and a second terminal connected to the pulling-up control node.

3. The shift register unit according to claim 2, wherein the signal of the first cock signal terminal, the signal of the second dock signal terminal, and the signal of the third dock signal terminal are square wave signals, and correspond to a previous stage output signal, the present stage output signal and a next stage output signal respectively, wherein the previous stage output signal is an output signal of a previous stage of shift register unit adjacent to the shift register unit, and the next stage output signal is an output signal of a next stage of shift register unit adjacent to the shift register unit.

4. The shift register unit according to claim 1, wherein the power supply terminal is connected to the second dock signal terminal, so that the signal of the second dock signal terminal is provided to the power supply terminal to pull down the potential of the pulling-up control node and the signal of the present stage output terminal.

5. The shift register unit according to claim 1, wherein the inputting circuit comprises:

a first transistor having first electrode and strobe electrode connected to the first signal input terminal, and second electrode connected to the pulling-up control node.

6. The shift register unit according to claim 1, wherein the pulling-up circuit comprises: a first capacitor, having first terminal connected to the pulling-up control node; and a second transistor, having first electrode connected to the second clock signal terminal, strobe electrode connected to a second terminal of the first capacitor, and second electrode connected to the present stage output terminal.

7. The shift register unit according to claim 1, wherein the resetting circuit comprises: a fifth transistor, having first electrode connected to the pulling-up control node, strobe electrode connected to the second signal input terminal, and second electrode connected to the power supply terminal; and a sixth transistor, having first electrode connected to the present stage output terminal, strobe electrode connected to the second signal input terminal, and second electrode connected to the power supply terminal.

8. The shift register unit according to claim 1, wherein the isolating circuit is further connected to the third clock signal terminal, and comprises:

a third capacitor having a first terminal connected to the third clock signal terminal and a second terminal connected to the pulling-up control node.

9. The shift register unit according to claim 8, wherein the signal of the first cock signal terminal, the signal of the second dock signal terminal, and the signal of the third dock signal terminal are square wave signals, and correspond to a previous stage output signal, the present stage output signal and a next stage output signal respectively, wherein the previous stage output signal is an output signal of a previous stage of shift register unit adjacent to the shift register unit, and the next stage output signal is an output signal of a next stage of shift register unit adjacent to the shift register unit.

10. A strobe driving circuit, comprising N stages of shift register units, wherein the N stages of shift register units are a first shift register unit to a N-th shift register unit, and each of the shift register units is the shift register unit according to claim 1, where N is a natural number, a first signal input terminal of each of a second shift register unit to the N-th shift register unit is connected to an output terminal of a previous stage of shift register unit adjacent thereto, a second signal input terminal of each of the first shift register unit to a (N−1)-th shift register unit is connected to an output terminal of a next stage of shift register unit adjacent thereto.

11. An array substrate, comprising the strobe driving circuit according to claim 10.

12. A display apparatus, comprising the array substrate according to claim 11.

13. A driving method for a shift register unit, the shift register unit comprising an inputting circuit, a pulling-up circuit, a pulling-down circuit, a resetting circuit and an isolating circuit, wherein the inputting circuit is connected to a first signal input terminal and a pulling-up control node, the pulling-up circuit is connected to the pulling-up control node, a second clock signal terminal and a present stage output terminal, the pulling-down circuit is connected to a third clock signal terminal, the pulling-up control node, the present stage output terminal and a power supply terminal, the resetting circuit is connected to a second signal input terminal, the pulling-up control node, the present stage output terminal and the power supply terminal and the isolating circuit is connected to a first clock signal terminal, the second clock signal terminal, the third clock signal terminal and the pulling-up control node, and configured to reduce signal fluctuation in the shift register unit caused by signals of respective clock signal terminals, the pulling-down circuit comprises:

a third transistor, having first electrode connected to the pulling-up control node, strobe electrode connected to the third clock signal terminal, and second electrode directly connected to the power supply terminal; and a fourth transistor, having first electrode connected to the present stage output terminal, strobe electrode connected to the third clock signal terminal, and second electrode directly connected to the power supply terminal, wherein the isolating circuit is further connected to a first clock terminal, and comprises:

a second capacitor having a first terminal directly electrically connected to the first clock signal terminal and a second terminal directly electrically connected to the pulling-up control node; and a fourth capacitor having a first terminal directly electrically connected to the second clock signal terminal and a second terminal directly electricallyconnected to the pulling-up control node, the driving method comprises:

in a first phase, the inputting circuit pulls up a potential of the pulling-up control node to a high level of a first signal input terminal through a signal of the first signal input terminal, and the pulling-up circuit stores the high level of the first signal input terminal;

in a second phase, the pulling-up control node controls the pulling-up circuit to provide a high level of the second clock signal terminal to the present stage output terminal to output a present stage output signal;

in a third phase, the pulling-down circuit pulls down the potential of the pulling-up control node and the signal of the present stage output terminal to a low level of the power supply terminal according to a signal of the third clock signal terminal; and in a fourth phase, the resetting circuit resets the potential of the pulling-up control node to a low level according to the signal of the second signal input terminal, and pulls down the signal of the present stage output terminal to a low level.

14. The driving method according to claim 13, wherein a signal of the first clock signal terminal, a signal of the second clock signal terminal, and a signal of the third clock signal are square wave signals, and correspond to a previous stage output signal, the present stage output signal and a next stage output signal respectively, wherein the previous stage output signal is an output signal of a previous stage of shift register unit adjacent to the shift register unit, and the next stage output signal is an output signal of a next stage of shift register unit adjacent to the shift register unit.

\* \* \* \* \*